United States Patent
Hsieh et al.

(10) Patent No.: US 7,715,268 B2
(45) Date of Patent: May 11, 2010

(54) NON-VOLATILE STORAGE APPARATUS AND A CONTROL METHOD THEREOF

(75) Inventors: Hsiang-An Hsieh, Sindian (TW); Li-Pai Chen, Chung Ho (TW); Ming-Dar Chen, Chung Ho (TW)

(73) Assignee: A-Data Technology Co., Ltd., Taipei (TW)

( * ) Notice: Subject to any disclaimer, the term of this patent is extended or adjusted under 35 U.S.C. 154(b) by 653 days.

(21) Appl. No.: 11/590,891

(22) Filed: Nov. 1, 2006

(65) Prior Publication Data

US 2007/0291569 A1 Dec. 20, 2007

(30) Foreign Application Priority Data

Jun. 16, 2006 (TW) .............................. 95121802 A

(51) Int. Cl.
*G11C 5/14* (2006.01)
(52) U.S. Cl. ................... 365/228; 365/189.09
(58) Field of Classification Search ................ 365/226, 365/189.09
See application file for complete search history.

(56) References Cited

U.S. PATENT DOCUMENTS

| 2004/0012997 A1* | 1/2004 | Mihara .................... 365/185.2 |
| 2005/0094471 A1* | 5/2005 | Obana et al. ................ 365/222 |
| 2005/0276110 A1* | 12/2005 | Sakurai et al. ......... 365/185.18 |
| 2006/0044917 A1* | 3/2006 | Kawakami et al. .......... 365/226 |

* cited by examiner

*Primary Examiner*—Vu A Le
*Assistant Examiner*—Han Yang
(74) *Attorney, Agent, or Firm*—Rosenberg, Klein & Lee

(57) ABSTRACT

Storage apparatus can support various memory units with different standards based on the method which drives the power control-and-switch circuit in the power management unit according to a control signal caused by the ID code of a memory unit to control the second booster for further increasing the level of the external voltage or control the second regulator for further regulating or decreasing the level of the external voltage.

13 Claims, 4 Drawing Sheets

NON-VOLATILE STORAGE APPARATUS AND A CONTROL METHOD THEREOF

BACKGROUND OF THE INVENTION

1. Field of the Invention

The present invention relates to a storage apparatus, and more particularly to a non-volatile storage apparatus and a control method thereof.

2. Description of the Prior Art

In FIG. 1, a block diagram of the power management unit of the previous invention is shown. According to the detection voltage that is predeterminedly stored in the voltage detector 114, the power management unit 110 controls the booster 112 to increase the external voltage $V_{EXT}$, controls the regulator 111 to regulate or reduce the external voltage $V_{EXT}$ for further supply to the memory unit. Wherein, the detection voltage is higher than the minimum operating voltage of the memory unit and lower than the operating voltage $V_{DD}$ thereof.

However, each memory unit includes an individual range of operating voltage. Hence, if the non-volatile storage apparatus uses memory units of various standards and adjusts the external voltage VEXT via only the fixed and detection voltage, the power management unit 110 will not support the memory units of various standards. In this case, it is limited to using the non-volatile storage apparatus.

SUMMARY OF THE INVENTION

It is an object of the present invention that the non-volatile storage apparatus can support various memory units of different standards.

It is another object of the present invention that the non-volatile storage apparatus still operates smoothly when the external voltage is out of the voltage range that the memory unit supports.

It is another object of the present invention that the non-volatile storage apparatus uses an identification code for each memory unit of various standards to adjust the second operating voltage.

It is another object of the present invention that the power management unit-increases, regulates or reduces the external voltage based on a control signal and a detection signal to supply the memory unit, wherein the control signal is affected by the identification code of the memory unit, and the external voltage affects the detection signal.

In order to achieve the above objects, the present invention provides a non-volatile storage apparatus that includes a power management unit, a memory unit and a control unit. The power management unit receives an external voltage and adjusts the external voltage based on a control signal for further producing a first operating voltage and a second operating voltage. The memory unit works via the second operating voltage and stores digital information. The control unit is driven by the first operating voltage, uses the external voltage to adjust the voltage level of an external signal between an application device and the non-voltage storage apparatus to adapt to the external voltage, and uses the second operating voltage to adjust the voltage level of an internal signal between the control unit and the memory unit to adapt to the second operating voltage.

Furthermore, the control unit produces the control signal via an identification code stored in the memory unit. Hence, the power management unit can adjust the second operating voltage for further driving the memory unit via the adjusted second operating voltage to work normally.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
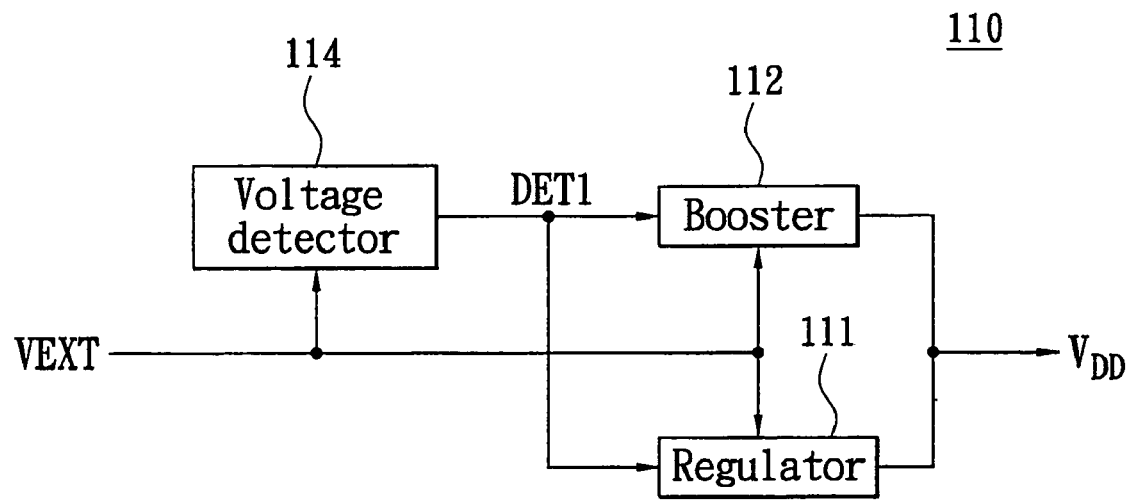
FIG. 1 is a system block diagram that illustrates the best embodiment of the present invention.
Figure 2:
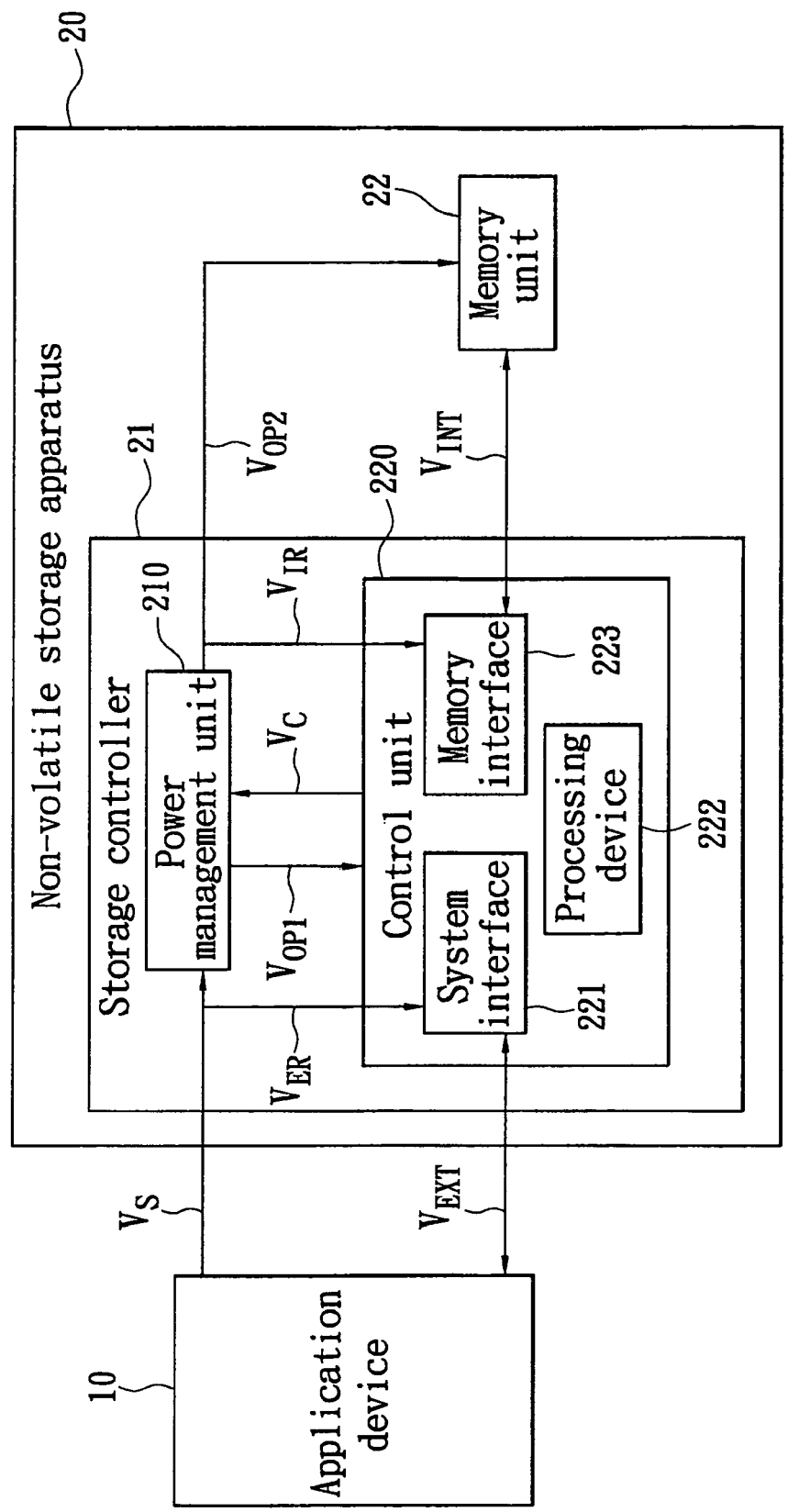
FIG. 2 is a block diagram that illustrates the non-volatile storage apparatus of the present invention.

In FIG. 2, a block diagram that illustrates the non-volatile storage apparatus of the present invention is shown. The non-volatile storage apparatus 20 includes a storage controller 21 and a memory unit 22. The storage controller 21 connects to an application device 10 outside the non-volatile storage apparatus 20. The storage controller 21 receives an external voltage $V_S$ supplied to the non-volatile storage apparatus 20, and digital signals are transmitted between the application device 10 and the storage controller 21. The memory unit 22 connects to the storage controller 21 to store the digital data outputted by the application device 10. The memory unit 22 can be a non-volatile memory unit and includes at least one non-volatile memory. The external voltage $V_S$ is the power supply voltage for the non-volatile storage apparatus 20.

The storage controller 21 includes a power management unit 210 and a control unit 220. The power management unit 210 connects to the application device 10 and memory unit 22 and adjusts the external voltage $V_S$ to adapt to the memory unit 22 based on the standards of the memory unit 22 and the control signal $V_C$ that is outputted by the control unit 220. That is, the external voltage has to be adjusted to be the second operating voltage $V_{OP2}$. The power management unit 210 can regulate the external voltage $V_S$ to supply the control unit 220, that is, the power management unit 210 can produce a first operating voltage $V_{OP1}$.

The control unit 220 includes a system interface 221, a processing device 222 and a memory interface 223. The system interface 221 connects to the application device 10. The memory interface 223 connects to the memory unit 22. The processing device 222 connects to the system interface 221 and the memory interface 223. The processing device 222 processes the data interchange between the memory unit 22 and the application device 10 according to the control program in the control unit 220.

However, the second operating voltage $V_{OP2}$ is different to the external voltage $V_S$, so the voltage level $V_{INT}$ of the internal signal between the memory unit 22 and the memory interface 223 may be larger than the voltage level $V_{EXT}$ of the external signal between the application device 10 and the system interface 221. Hence, the system interface 221 has to use the external voltage $V_S$ as the external reference voltage $V_{ER}$ and needs to adjust the voltage level $V_{EXT}$ of the external signal to adapt to the external voltage $V_S$. Moreover, the memory interface 223 has to use the second operating voltage $V_{OP2}$ as the internal reference voltage $V_{IR}$ and needs to adjust the voltage level $V_{INT}$ of the internal signal to adapt to the second operating voltage $V_{OP2}$.

On the other hand, memory units from different manufacturers include various standards, that is, each memory unit owns an individual identification code.

Figure 3:
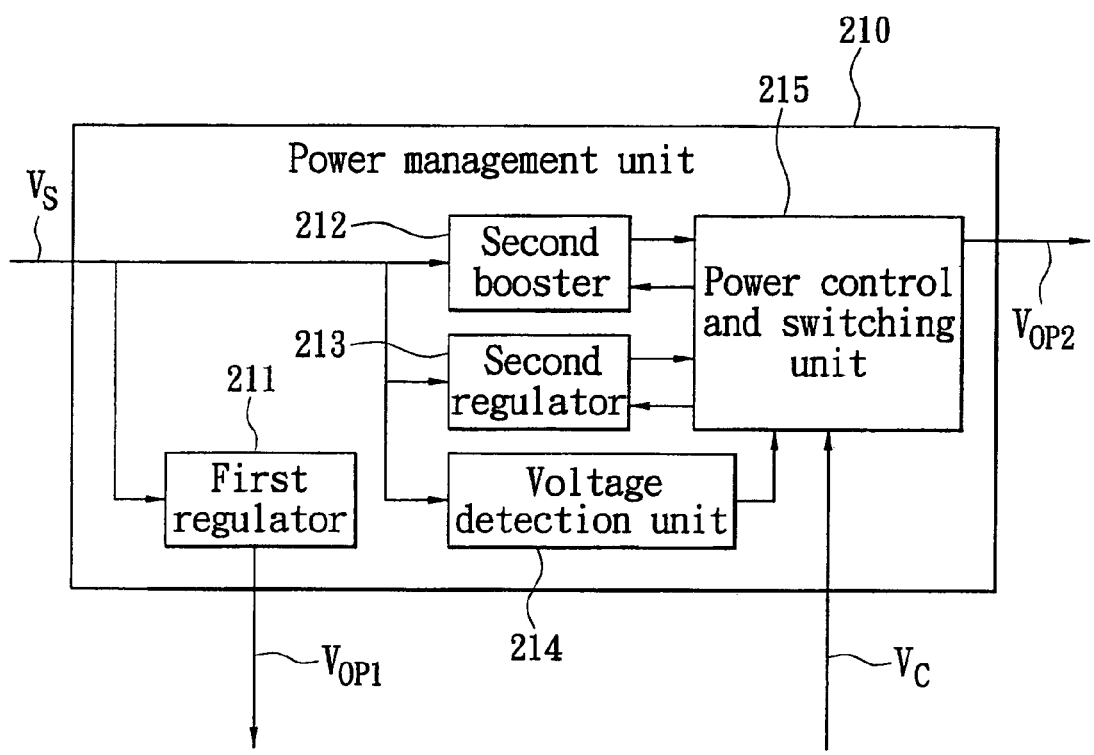
FIG. 3 is a block diagram of the power management unit of the present invention.

In FIG. 3, a block diagram of the power management unit of the present invention is shown. The power management unit 210 includes a first regulator 211, a second booster 212, a second regulator 213, a voltage detection unit 214, and a power control and switching unit 215. All of the first and second regulators 211 and 213, the second booster 212 and the voltage detection unit 214 connect to the application device 10. The power control and switching unit 215 connects the control unit 220 and the memory unit 22.

The first regulator 211 regulates or reduces the external voltage $V_S$ provided by the application device 10 to produce a first operating voltage $V_{OP1}$ for further supplying the first operating voltage $V_{OP1}$ to the control unit 220. The second regulator 213 is controlled by the power control and switching unit 215 and regulates or reduces the external voltage $V_S$ to produce a second operating voltage $V_{OP2}$ for further supplying the second operating voltage $V_{OP2}$ to the memory unit 22 and the control unit 220. The voltage detection unit 214 detects the external voltage $V_S$ to produce a detection signal that is the reference for the power control and switching unit 215. The power control and switching unit 215 receives the external voltage $V_S$ from the second booster 212 or the second regulator 213 to produce the second operating voltage $V_{OP2}$ according to the control signal $V_C$ outputted by the control unit 220, and the detection signal outputted by the voltage detection unit 214. Moreover, the power control and switching unit 215 determines whether the external $V_S$ has to be increased, regulated or reduced.

Figure 4:
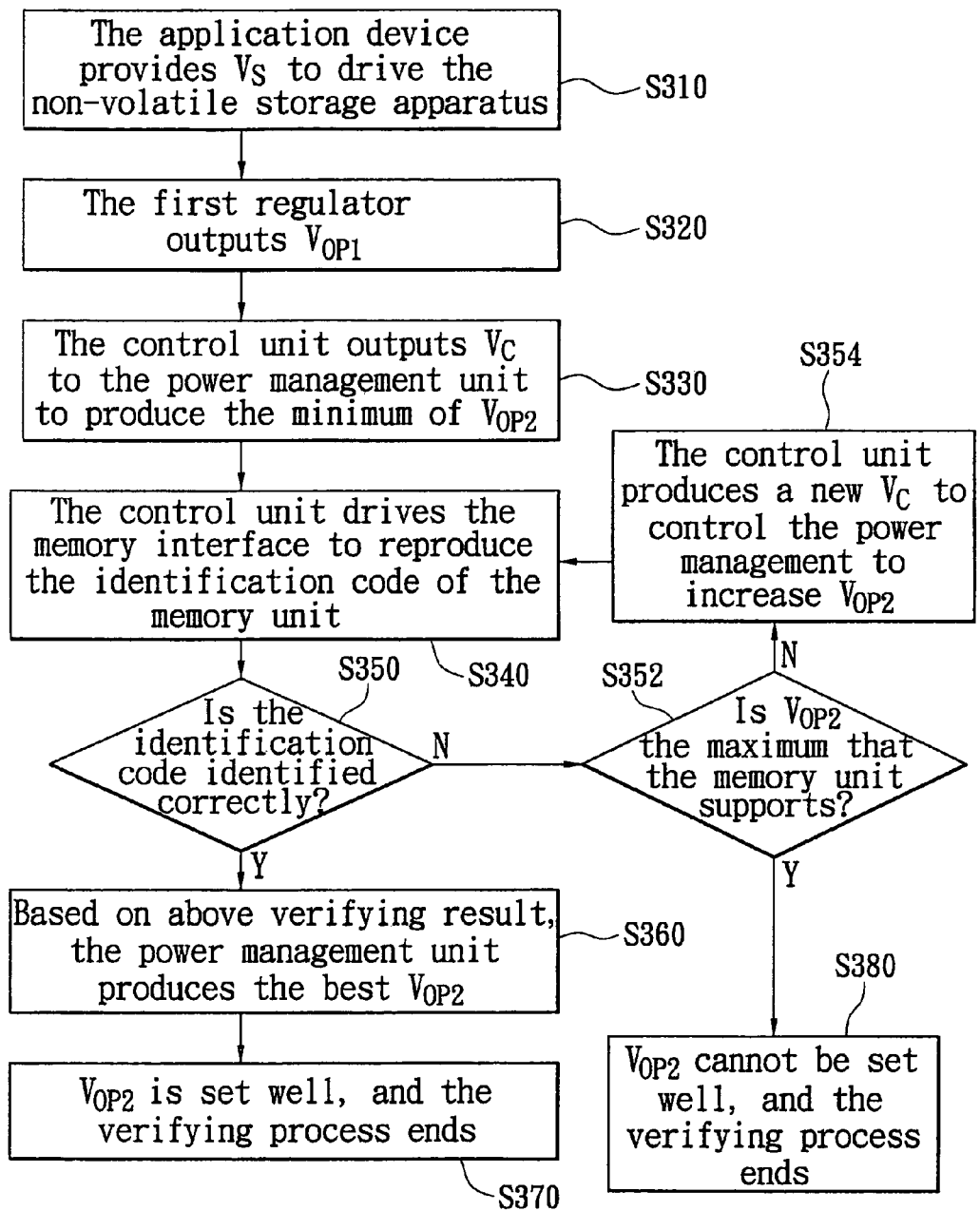
FIG. 4 is a flow chart of the non-volatile storage apparatus verifying the memory unit to adjust the second operating voltage, of the present invention.

In FIG. 4, a flow chart in which the non-volatile storage apparatus identifies the memory unit to adjust the second operating voltage, of the present invention is shown. Firstly, if the non-volatile storage apparatus 20 connects to the application device 10 and is driven, the application device 10 will begin supplying the external voltage $V_S$ to the non-volatile storage apparatus 20 (S310).

Next, the first regulator 211 in the power management unit 210 receives the external voltage $V_S$ and adjusts the external voltage $V_S$ to become the first operating voltage $V_{OP1}$. The control unit 220 operates according to the first operating voltage $V_{OP1}$, processes the data interchange between the application device 10 and the memory unit 22, adjusts the voltage level $V_{INT}$ of the internal signal to adapt to the second operating voltage $V_{OP2}$ and adjusts the voltage level $V_{EXT}$ of the external signal to the external voltage $V_S$ (S320).

If the power management unit 210 supplies the first operating voltage $V_{OP1}$ to the control unit 220, the control unit 220 will output a control signal $V_C$ to the power control and switching unit 215. Then, the power control and switching unit 215 drives the second regulator 213 to adjust the external voltage $V_S$ according to the control signal $V_C$ and the detection signal to be the minimum second operating voltage $V_{OP2}$ that the non-volatile storage apparatus 20 supports, for further supplying the minimum second operating voltage $V_{OP2}$ to the memory unit 22 (S330). However, every memory unit 22 from each different supplier includes an exclusive standard thereof. That is, the memory interface 223 includes an exclusive identification code. Hence, after receiving the minimum second operating voltage $V_{OP2}$, the memory unit 220 transmits the identification code thereof to the memory interface 223 in the control unit 22 (S340).

The control unit 220 further determines whether the identification code can be verified so as to identify some information of the memory unit 22, such as the manufacturer, the product standard, etc (S350). If the identification code cannot be verified or is identified as a random code, the second operating voltage $V_{OP2}$ will not be sufficient for the memory unit 22 to work, and the control unit 220 will determine whether the second operating voltage $V_{OP2}$ is the maximum voltage that the non-volatile storage apparatus 20 can support (S352).

If the second operating voltage $V_{OP2}$ is not the maximum voltage, that is, the non-volatile storage apparatus 20 can support the standard of the memory unit 22, the control unit 220 will produce a new control signal $V_C$ to the power control and switching unit 215 according to the above verifying result. The power control and switching unit 215 can control the second booster 212 to increase the external voltage $V_S$ for further updating the second operating voltage $V_{OP2}$. In this case, the memory interface 223 can continuously try to obtain the correct identification code (S354).

If the second operating voltage $V_{OP2}$ is the maximum voltage, that is, the non-volatile storage apparatus 20 cannot support the standard of the memory unit 22, the control unit 220 will stop the process of verifying the identification code of the memory unit 22, and the power management unit 210 will not set the second operating voltage $V_{OP2}$ correctly to supply the memory unit 22 (S380).

On the other hand, if the identification code is verified, that is, the non-volatile storage apparatus 20 can support the standard of the memory unit 22, the second operating voltage $V_{OP2}$ will be sufficient for the memory unit 22 to work, and the control unit 220 will provide a new control signal $V_C$ to the power control and switching unit 215 according to the verifying result in this case. The power control and switching unit 215 further controls the second booster 212 or the second regulator 213 to adjust the external voltage $V_S$ for further producing the suitable second operating voltage $V_{OP2}$ (S360).

Actually, if the external voltage $V_S$ is lower than the range of the second operating voltage $V_{OP2}$ that is sufficient for the memory unit 22 to work, the power control and switching unit 215 will control the second booster 212 to increase the external voltage $V_S$ for further producing a further higher second operating voltage $V_{OP2}$. If the external voltage $V_S$ is in the range of the second operating voltage $V_{OP2}$ that is sufficient for the memory unit 22 to work, the power control and switching unit 215 will control the second regulator 213 to regulate the external voltage $V_S$. If the external voltage $V_S$ is higher than the range of the second operating voltage $V_{OP2}$ that is sufficient for the memory unit 22 to work, the power control and switching unit 215 will control the second regulator 213 to reduce the external voltage $V_S$ for further producing a further lower second operating voltage $V_{OP2}$.

Finally, if the last second operating voltage $V_{OP2}$ is in the range of the second operating voltage that is sufficient for the memory unit 22 to work, the control unit 220 will close the process for verifying the identification code (S370).

An advantage of the present invention is that the non-volatile storage apparatus can support various memory units of different standards.

Another advantage of the present invention is that the non-volatile storage apparatus still operates smoothly when the external voltage is out of the voltage range that the memory unit supports.

Another advantage of the present invention is that the non-volatile storage apparatus uses an identification code for each memory unit of various standards to adjust the second operating voltage.

Yet another advantage of the present invention is that the power management unit increases, regulates or reduces the external voltage based on a control signal and a detection signal to supply the memory unit, wherein the control signal is affected by the identification code of the memory unit, and the external voltage affects the detection signal.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A control method for adjusting voltages and the voltage level of a signal in a non-volatile storage apparatus, comprising:
   adjusting an external voltage of the non-volatile storage apparatus to produce a first operating voltage supplying the non-volatile storage apparatus to process data;
   drawing out an identification code from a memory unit in the non-volatile storage apparatus to adjust the external voltage to a second operating voltage supplying the non-volatile storage apparatus to adjust the voltage of an internal signal and store digital information;
   adjusting the voltage level of an external signal outputted by the non-volatile storage apparatus to conform with the external voltage according to the external voltage; and
   adjusting the voltage level of to internal signal in to non-volatile storage apparatus to conform with to second operating voltage according to the second operating voltage.

2. The control method for adjusting voltages and the voltage level of a signal in a non-volatile storage apparatus according to claim 1, further comprising:
   drawing out the identification code from the memory unit;
   producing a control signal based on the identification code; and
   adjusting the external voltage to produce the second operating voltage according to the control signal and a detection signal.

3. The control method for adjusting voltages and the voltage level of a signal in a non-volatile storage apparatus according to claim 2, further comprising: determining the external voltage based on the detection signal to determine whether to step up, step down or regulate the voltage so as to provide the second operating voltage.

4. The control method for adjusting voltages and the voltage level of a signal in a non-volatile storage apparatus according to claim 3, wherein increasing the external voltage when the external voltage is lower than the range of the second operating voltage, reducing the external voltage when the external voltage is higher than the range of the second operating voltage and regulating the external voltage when the external voltage is between the range of the second operating voltage.

5. The control method for adjusting voltages and the voltage level of a signal in a non-volatile storage apparatus according to claim 1, wherein producing the second operating voltage comprises:
   providing the minimum second operating voltage that the non-volatile storage apparatus supports, to the memory unit and a control unit;
   getting the identification code in the memory unit; and
   determining whether to correctly verify the identification code of the memory unit so as to adjust the second operating voltage to apply to the memory unit.

6. The control method for adjusting voltages and the voltage level of a signal in a non-volatile storage apparatus according to claim 5, wherein if the identification code is not verified correctly, the second operating voltage will not be the operating voltage of the memory unit, and the non-volatile storage apparatus will adjust the second operating voltage from low to high, otherwise, if the identification code is verified correctly, the second operating voltage will be the operating voltage of the memory unit.

7. The control method for adjusting voltages and the voltage level of a signal in a non-volatile storage apparatus according to claim 6, wherein when the second operating voltage is the maximum the non-volatile storage apparatus supports, the identification code is not verified correctly, that is, the non-volatile storage apparatus does not support the memory unit and stops adjusting the second operating voltage.

8. The control method for adjusting voltages and the voltage level of a signal in a non-volatile storage apparatus according to claim 1, wherein the external signal is transmitted between a control unit and an application device in the non-volatile storage apparatus, and the internal signal is transmitted between the control unit and the memory unit, furthermore, the external and internal signals are independently adjusted.

9. The control method for adjusting voltages and the voltage level of a signal in a non-volatile storage apparatus according to claim 8, wherein the external signal is transmitted between the application device and a system interface of the control unit, and the internal signal is transmitted between the memory unit and a memory interface of the control unit, furthermore, the voltage level of the external signal is adjusted by the system interface, and the voltage level of the internal signal is adjusted by the memory interface.

10. A control method for adjusting voltages and the voltage level of a signal in a non-volatile storage apparatus, comprising:
    obtaining an identification code from a memory unit;
    inducing a control signal based on the identification code;
    providing a minimum second operating voltage that the non-volatile storage apparatus supports, to a control unit and the memory unit according to a detection signal and the control signal; and
    determining whether or not to verify the memory unit to adjust an external voltage in order to support the second operating voltage for the memory unit;
    wherein if the identification code is not verified, the second operating voltage does not act as the operating voltage of the memory unit, but the non-volatile storage a apparatus adjusts the second operating voltage from low to high; if the identification code is identified, the second operating voltage acts as the operating voltage of the memory unit.

11. The control method for adjusting voltages and the voltage level of a signal in a non-volatile storage apparatus according to claim 10, wherein when the second operating voltage is the maximum the non-volatile storage apparatus supports, the identification code is not identified correctly, that is, the non-volatile storage apparatus does not support the memory unit and stops adjusting the second operating voltage.

12. The control method for adjusting voltages and the voltage level of a signal in a non-volatile storage apparatus according to claim 10, further comprising determining whether the external voltage is in an operating range of the memory unit based on the detection signal, so as to step up, regulate, or step down.

13. The control method for adjusting voltages and the voltage level of a signal in a non-volatile storage apparatus according to claim 12, wherein the external voltage is increased if the external voltage is lower than the operating range, the external voltage is reduced if the external voltage is higher than the operating range, and the external voltage is regulated if the external voltage is in the operating range.

* * * * *